(12) United States Patent
Uchikoba et al.

(10) Patent No.: US 7,471,579 B2
(45) Date of Patent: Dec. 30, 2008

(54) SEMICONDUCTOR MEMORY AND TEST METHOD FOR THE SAME

(75) Inventors: Toshitaka Uchikoba, Hyogo (JP); Hiroyuki Sadakata, Osaka (JP)

(73) Assignee: Panasonic Corporation, Osaka (JP)

( * ) Notice: Subject to any disclaimer, the term of this patent is extended or adjusted under 35 U.S.C. 154(b) by 19 days.

(21) Appl. No.: 11/826,566

(22) Filed: Jul. 17, 2007

(65) Prior Publication Data

US 2008/0019199 A1 Jan. 24, 2008

(30) Foreign Application Priority Data

Jul. 24, 2006 (JP) .............................. 2006-200540

(51) Int. Cl.
*G11C 11/00* (2006.01)
(52) U.S. Cl. ................... 365/201; 365/230.05
(58) Field of Classification Search ................. 365/201, 365/230.05
See application file for complete search history.

(56) References Cited

U.S. PATENT DOCUMENTS 5,610,871 A * 3/1997 Hidaka .................. 365/230.03
5,612,919 A * 3/1997 Arimoto ...................... 365/201
5,701,269 A * 12/1997 Fujii ...................... 365/185.13
5,748,538 A * 5/1998 Lee et al. ............... 365/185.06
6,327,202 B1* 12/2001 Roohparvar ................ 365/203

FOREIGN PATENT DOCUMENTS

JP 8-195100 7/1996

* cited by examiner

*Primary Examiner*—Michael T Tran
(74) *Attorney, Agent, or Firm*—McDermott Will & Emery LLP

(57) ABSTRACT

In a semiconductor memory, a sub bit line hierarchical switch is provided correspondingly to each sub bit line between the sub bit line and a main bit line corresponding to the sub bit line, and a complementary sub bit line hierarchical switch is provided correspondingly to each complementary sub bit line between the complementary sub bit line and a complementary main bit line corresponding to the complementary sub bit line. Furthermore, the semiconductor memory includes a hierarchical switch control unit for turning off all the sub bit line hierarchical switch and the complementary sub bit line hierarchical switch when a given signal is input.

14 Claims, 7 Drawing Sheets

SEMICONDUCTOR MEMORY AND TEST METHOD FOR THE SAME

CROSS-REFERENCE TO RELATED APPLICATIONS

This application claims priority under 35 U.S.C. §119 on Patent Application No. 2006-200540 filed in Japan on Jul. 24, 2006, the entire contents of which are hereby incorporated by reference.

BACKGROUND OF THE INVENTION

The present invention relates to a semiconductor memory including a test circuit for detecting cell transistor leakage failure of a memory cell and a test method for the semiconductor memory.

A system LSI (large scale integrated circuit) mixedly includes semiconductor memories such as a DRAM (dynamic RAM) and an SRAM (static RAM), and the proportion of semiconductor memories in the chip area of a system LSI is increasing year by year.

Some of these semiconductor memories include a memory cell in which a transistor (hereinafter referred to as the access transistor) and a capacitor (hereinafter referred to as the memory cell capacitor) are connected to each other in series. In such a semiconductor memory, when there is failure in, for example, a PN junction formed between a node of the access transistor and a substrate, the level of a sub bit line may be lowered due to leakage caused in this defective memory cell. In this case, the potential of nodes of the other normal memory cells connected to the same sub bit line is lowered. In particular, in the case where data written in a memory cell capacitor of a normal memory cell is at H level, a potential difference caused between the source and the drain of the access transistor is increased. Therefore, the leakage caused in the access transistor is accelerated, and hence, it is apprehended that the data stored in the normal memory cell may be lost (which corresponds to the so-called disturbed state). Accordingly, it is necessary to screen such a defective memory cell through a test.

Some of conventional semiconductor memories can be subjected to a test for an operation margin under severe conditions such as a case where the potential of a sub bit line is lowered (see, for example, Japanese Laid-Open Patent Publication No. 8-195100). In this technique, the operation margin is tested with the potential of a sub bit line pair lowered in a semiconductor memory having a hierarchical structure including main bit line pairs and sub bit line pairs. Specifically, in a given block of memory cells of this semiconductor memory, one sub bit line pair is precharged and then placed in a floating state and main bit lines of a corresponding main bit line pair are short-circuited so as to lower the potential of the sub bit line pair, and under these conditions, the operation margin is checked. Through this test, a semiconductor memory having a sufficient margin for leakage can be selected.

This test is, however, performed on each block of the semiconductor memory, and hence, as the capacity of the semiconductor memory is increased and the number of blocks is increased, the time necessary for the test is increased, which disadvantageously increases the test cost. Furthermore, leakage of a memory cell itself cannot be detected in this test.

SUMMARY OF THE INVENTION

The present invention was devised in consideration of the aforementioned conventional problems, and an object of the invention is providing a semiconductor memory that can be tested for leakage in a shorter period of time.

In order to achieve the object, the semiconductor memory according to one aspect of the invention includes a plurality of main bit line pairs each composed of a main bit line and a complementary main bit line; a plurality of sub bit line pairs each composed of a sub bit line and a complementary sub bit line and respectively corresponding to the plurality of main bit line pairs; a plurality of word lines disposed to intersect the plurality of sub bit line pairs; memory cells disposed on intersecting points between the sub bit line and each of the word lines and between the complementary sub bit line and each of the word lines; a sub bit line hierarchical switch disposed correspondingly to each sub bit line between the sub bit line and a main bit line corresponding to the sub bit line; a complementary sub bit line hierarchical switch disposed correspondingly to each complementary sub bit line between the complementary sub bit line and a complementary main bit line corresponding to the complementary sub bit line; and a hierarchical switch control unit for turning off all of the sub bit line hierarchical switch and the complementary sub bit line hierarchical switch when a given signal is input.

The semiconductor memory according to another aspect of the invention includes a plurality of main bit line pairs each composed of a main bit line and a complementary main bit line; a plurality of sub bit line pairs each composed of a sub bit line and a complementary sub bit line and respectively corresponding to the plurality of main bit line pairs; a plurality of word lines disposed to intersect the plurality of sub bit line pairs; memory cells disposed on intersecting points between the sub bit line and each of the word lines and between the complementary sub bit line and each of the word lines; a sub bit line hierarchical switch disposed correspondingly to each sub bit line between the sub bit line and a main bit line corresponding to the sub bit line; a complementary sub bit line hierarchical switch disposed correspondingly to each complementary sub bit line between the complementary sub bit line and a complementary main bit line corresponding to the complementary sub bit line; and a hierarchical switch control unit for turning off all of the sub bit line hierarchical switch or the complementary sub bit line hierarchical switch when a given signal is input.

In still another aspect of the invention, the test method for the above-described semiconductor memory includes a precharge step of precharging the plurality of main bit line pairs; and a leakage accelerating step of supplying the given signal to the hierarchical switch control unit and increasing an absolute value of substrate potential of transistors included in the memory cells after completing the precharge step.

DETAILED DESCRIPTION OF THE INVENTION

Figure 1:
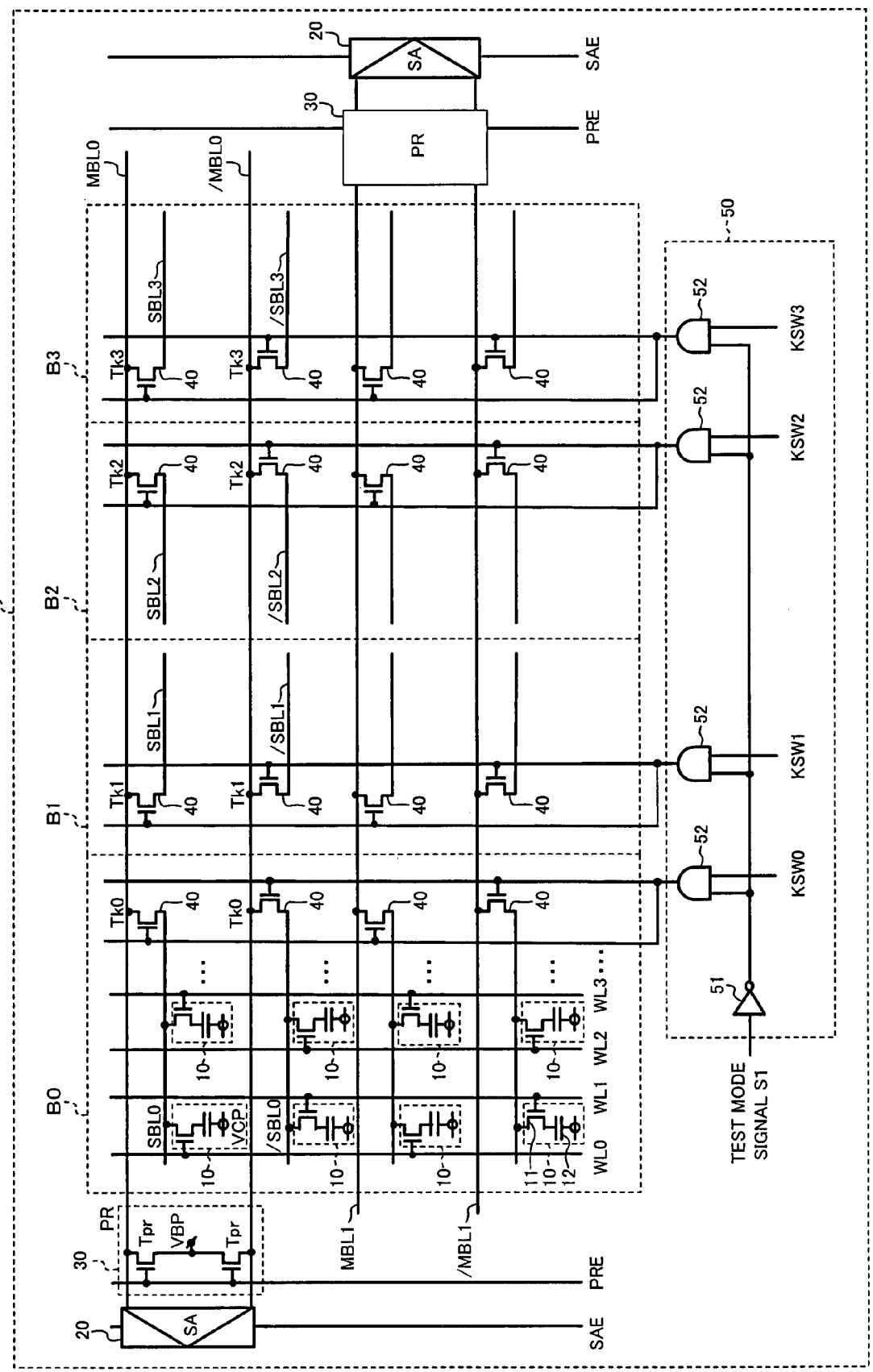
FIG. 1 is a block diagram for showing the architecture of a semiconductor memory according to Embodiment 1 of the invention.

Preferred embodiments of the invention will now be described with reference to the accompanying drawings. In embodiments and modifications described below, like reference numerals are used to refer to like elements once described so as to omit the description.

Embodiment 1

FIG. 1 is a block diagram for showing the architecture of a semiconductor memory 100 according to Embodiment 1 of the invention. The semiconductor memory 100 includes, as shown in FIG. 1, memory cells 10, sense amplifiers 20 (abbreviated as SA in FIG. 1), precharge circuits 30 (abbreviated as PR in FIG. 1), hierarchical switches 40, and a hierarchical switch control unit 50.

In FIG. 1, reference numerals SBL0 through SBL3 denote sub bit lines and /SBL0 through /SBL3 denote complementary sub bit lines. A combination of one sub bit line and one complementary sub bit line forms one sub bit line pair. In FIG. 1, a combination of the sub bit line SBL0 and the complementary sub bit line /SBL0, a combination of the sub bit line SBL1 and the complementary sub bit line /SBL1, a combination of the sub bit line SBL2 and the complementary sub bit line /SBL2 and a combination of the sub bit line SBL3 and the complementary sub bit line /SBL3 respectively form sub bit line pairs.

Also, reference numerals MBL0 and MBL1 denote main bit lines and /MBL0 and /MBL1 denote complementary main bit lines. A combination of one main bit line and one complementary main bit line forms one main bit line pair. In FIG. 1, a main bit line pair composed of the main bit line MBL0 and the complementary main bit line /MBL0 and a main bit line pair composed of the main bit line MBL1 and the complementary main bit line /MBL1 are representatively shown.

Four sub bit lines are disposed correspondingly to each main bit line. For example, the sub bit lines SBL0 through SBL3 are provided correspondingly to the main bit line MBL0. Each main bit line and the corresponding sub bit lines are connected to each other through the hierarchical switches 40. At this point, the hierarchical switch 40 connecting each main bit line to the corresponding sub bit line is designated as a sub bit line hierarchical switch.

Similarly, four complementary sub bit lines are disposed correspondingly to each complementary main bit line. For example, the complementary sub bit lines /SBL0 through /SBL3 are provided correspondingly to the complementary main bit line MBL0. Each complementary main bit line and the corresponding complementary sub bit lines are connected to each other through the hierarchical switches 40. At this point, the hierarchical switch 40 connecting the complementary main bit line and the corresponding complementary sub bit line is designated as a complementary sub bit line hierarchical switch. In FIG. 1 (and the drawings referred to below for describing the following embodiments), merely sub bit lines and complementary sub bit lines respectively corresponding to the main bit line MBL0 and the complementary main bit line /MBL0 are representatively shown with the reference numerals (such as SBL0).

Reference numerals WL0 through WL3, etc. denote word lines arranged to intersect the sub bit line pairs.

The memory cells 10 are provided on intersecting points between the word lines and the sub bit lines and intersecting points between the word lines and the complementary sub bit lines. Herein, a block of memory cells connected to sub bit lines intersecting the same word lines as shown in FIG. 1 is designated as a sub array (B0, B1, B2 or B3 in FIG. 1). The architecture shown in FIG. 1 includes four sub arrays.

Each memory cell 10 specifically includes an access transistor 11 and a memory cell capacitor 12. The gate terminal of the access transistor 11 is connected to the corresponding word line. Also, one of the other two terminals of the access transistor 11 is connected to the corresponding sub or complementary sub bit line, and the other is connected to one electrode (designated as a storage node) of the memory cell capacitor 12. Furthermore, a cell plate voltage VCP is applied to the other electrode of the memory cell capacitor 12 (designated as a cell plate).

Accordingly, when a voltage of H level (hereinafter sometimes referred to as the array voltage or the VDD voltage) is applied to a word line, charge is output to sub bit lines corresponding to memory cells 10 connected to this word line (namely, data is read from these memory cells).

The sense amplifier 20 is provided correspondingly to each main bit line pair, and in the case where a sense amplifier enable signal SAE input thereto is at H level, it amplifies a potential difference between the main bit line and the complementary main bit line.

The precharge circuit 30 is provided correspondingly to each main bit line pair, and in the case where a precharge enable signal PRE is at H level, it precharges the corresponding main bit line pair to precharge potential VBP. Specifically, each precharge circuit 30 includes two precharge transistors Tpr as shown in FIG. 1. In the case where the precharge enable signal PRE is at H level, the two precharge transistors Tpr are turned on.

Each hierarchical switch 40 is a transistor in this architecture. An output signal of the hierarchical switch control unit 50 is input to the gate terminal of each hierarchical switch 40 as described in detail below. In the case where the signal input to the gate terminal is at H level, the hierarchical switch is turned on, so as to electrically connect a sub bit line corresponding to this hierarchical switch 40 to the corresponding main bit line.

The hierarchical switch control unit 50 includes one inverter circuit 51 and a plurality of AND circuits 52 and receives a test mode signal S1 as an input. A test mode signal S1 is a signal corresponding to whether or not leakage is accelerated.

The inverter circuit 51 outputs a signal obtained by inverting the test mode signal S1.

The AND circuit 52 is provided correspondingly to each of the sub arrays. An output of the inverter circuit 51 is input to one of the input terminals of each AND circuit 52, and a hierarchical switch control signal KSW0, KSW1, KSW2 or KSW3 is input to the other input terminal thereof. Also, the output terminal of the AND circuit 52 is connected to the gate terminals of the hierarchical switches 40 included in the corresponding sub array.

<Operation of Semiconductor Memory 100>

Figure 2:
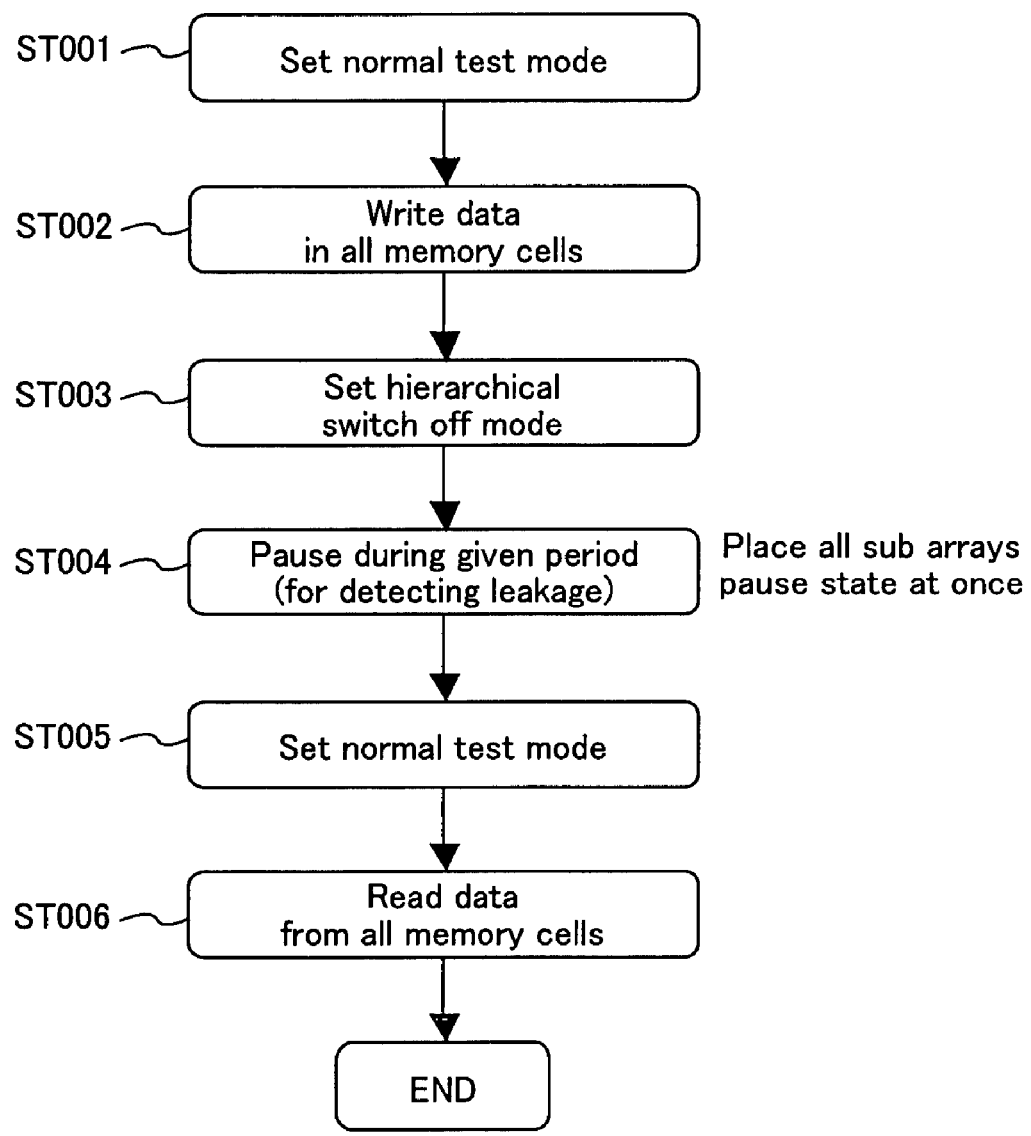
FIG. 2 is a flowchart of procedures of a leakage test.

In the semiconductor memory 100 described above, a leakage test for each sub bit line is performed through procedures shown in a flowchart of FIG. 2. Now, the procedures will be described with reference to a timing chart (shown in FIG. 3) of various signals such as the hierarchical switch control signal used for performing the leakage test.

(Step ST001)

In this step, the test mode signal S1 is set to L level (which state is designated as a normal test mode).

(Step ST002)

In this step, after writing data in all the memory cells 10, the main bit lines are precharged for making preparation for the leakage test. Specifically, 1 (corresponding to H level) is written as the data in this embodiment. Then, the precharge enable signal PRE is set to H level so as to turn on the two precharge transistors Tpr of each precharge circuit 30.

(Step ST003)

In this step, all the hierarchical switches 40 are turned off, so as to place all the sub bit lines in a floating state (which state is designated as a hierarchical switch off mode).

Specifically, the test mode signal S1 at H level is input to the inverter circuit 51. In the timing chart exemplified in FIG. 3, the test mode signal S1 is set to H level at time t0.

When the test mode signal S1 is set to H level, the output of the inverter circuit 51 becomes L level, and all the AND circuits 52 output a signal at L level regardless of the states of the hierarchical switch control signals KSW0 through KSW3. As a result, all the hierarchical switches are turned off, and the all the sub bit lines are electrically disconnected from the main bit lines to be placed in the floating state. Therefore, none of the sub bit lines is precharged by the precharge circuit 30 in this state.

(Step ST004)

In this step, the semiconductor memory 100 is placed in a quiescent (pause) state for accelerating leakage of the sub bit lines. In the timing chart of FIG. 3, a time period between time t2 and time t3 corresponds to the quiescent (pause) state.

Figure 3:
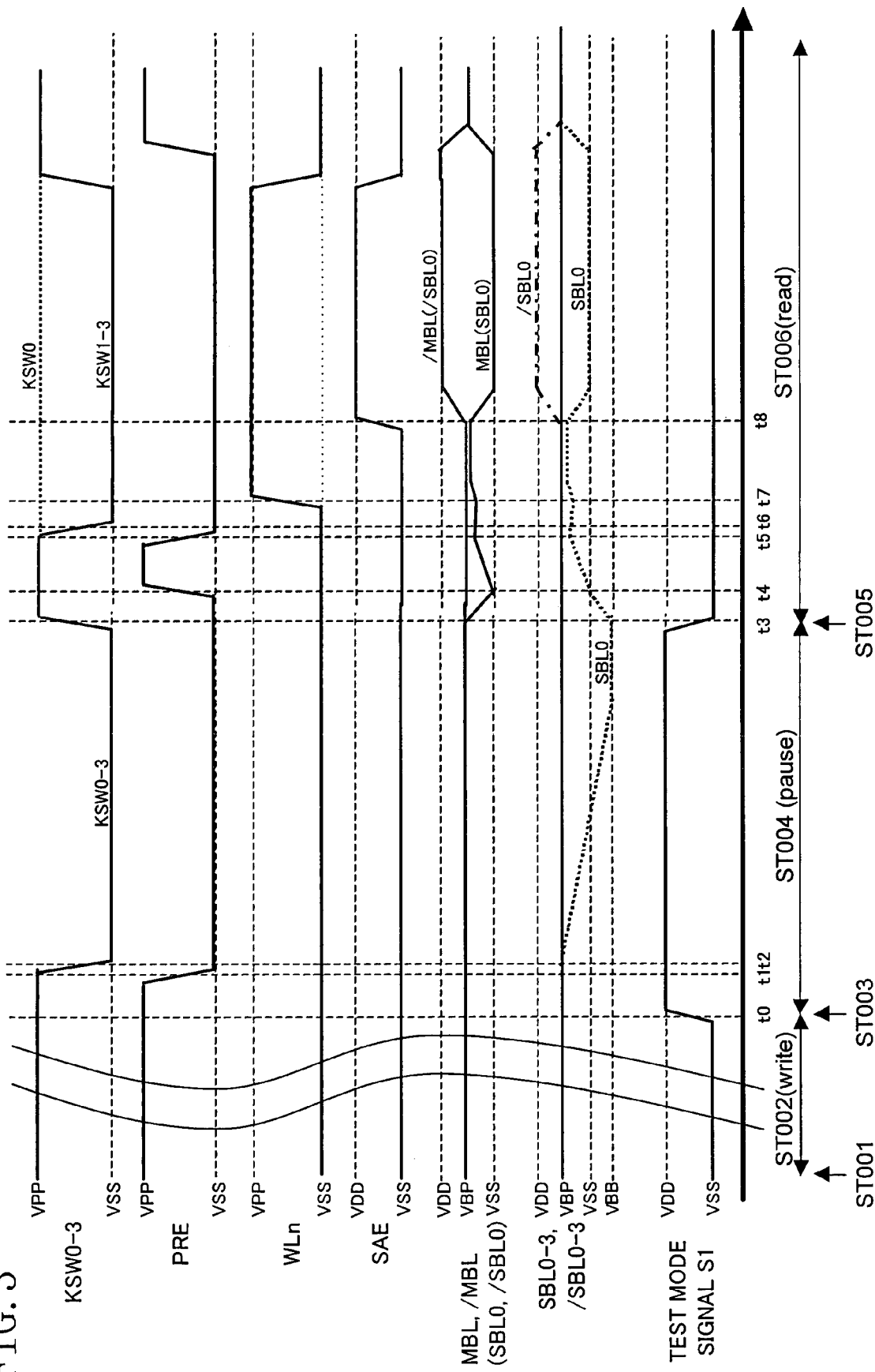
FIG. 3 is a timing chart for performing the leakage test on the semiconductor memory of Embodiment 1.

In the case where there is a leakage path between, for example, the sub bit line SBL0 and the substrate (assumed to have substrate potential VBB), the potential level of the sub bit line SBL0 is gradually lowered ultimately to the substrate potential VBB as shown in FIG. 3 because it is not precharged by the precharge circuit.

(Step ST005)

In this step, the test mode signal S1 is set to L level again. Thus, the hierarchical switches 40 can be controlled to be turned on/off in accordance with the hierarchical switch control signal. In the timing chart of FIG. 3, the test mode signal S1 is returned to L level at time t3.

(Step ST006)

In this step, data of all the memory cells are read. For this purpose, the precharge enable signal PRE is set to H level so as to perform the precharge. Then, a desired word line is activated, so as to read the data (that is 1 in this case) from the memory cells. Thereafter, the sense amplifier enable signal SAE is set to H level, so as to amplify a potential difference between the main bit line and the complementary main bit line by the sense amplifier 20. In the case where the output of the sense amplifier 20 is not 1, that is, the written data, there is leakage.

In the exemplified timing chart shown in FIG. 3, the precharge is performed in a time period from time t4 to time t5. If there is a leakage path between the sub bit line SBL0 and the substrate (assumed to have the substrate potential VBB), the potential of the sub bit line SBL0 is lowered to the level of the substrate potential VBB, and hence, the potential cannot be restored even when the sub bit line SBL0 is precharged. Subsequently, when any of the word lines is activated at time t7, the potential of the sub bit line SBL0 is increased but cannot reach the precharge potential VBP.

Under this condition, the sense amplifier enable signal SAE is set to H level at time t8 for performing the amplification by the sense amplifier 20, and thus, the potential of the sub bit line SBL0 is amplified to potential VSS and the potential of the complementary sub bit line /SBL0 is amplified to potential VDD.

In a normal condition, the potential of the sub bit line SBL0 should be the potential VDD because 1, that is, the data, has been read. However, the potential of the sub bit line SBL0 is the potential VSS, which means that the data is not correctly read. In other words, it is determined that the memory cell 10 to be read has failure (leakage failure). Similarly, all the memory cells 10 are read to be determined whether or not they have failure.

In this manner, according to this embodiment, all the sub bit lines are placed in the floating state at once in the leakage test, and therefore, the leakage can be accelerated at once in all the sub bit lines. Therefore, the time of the leakage test can be shortened.

Embodiment 2

Figure 4:
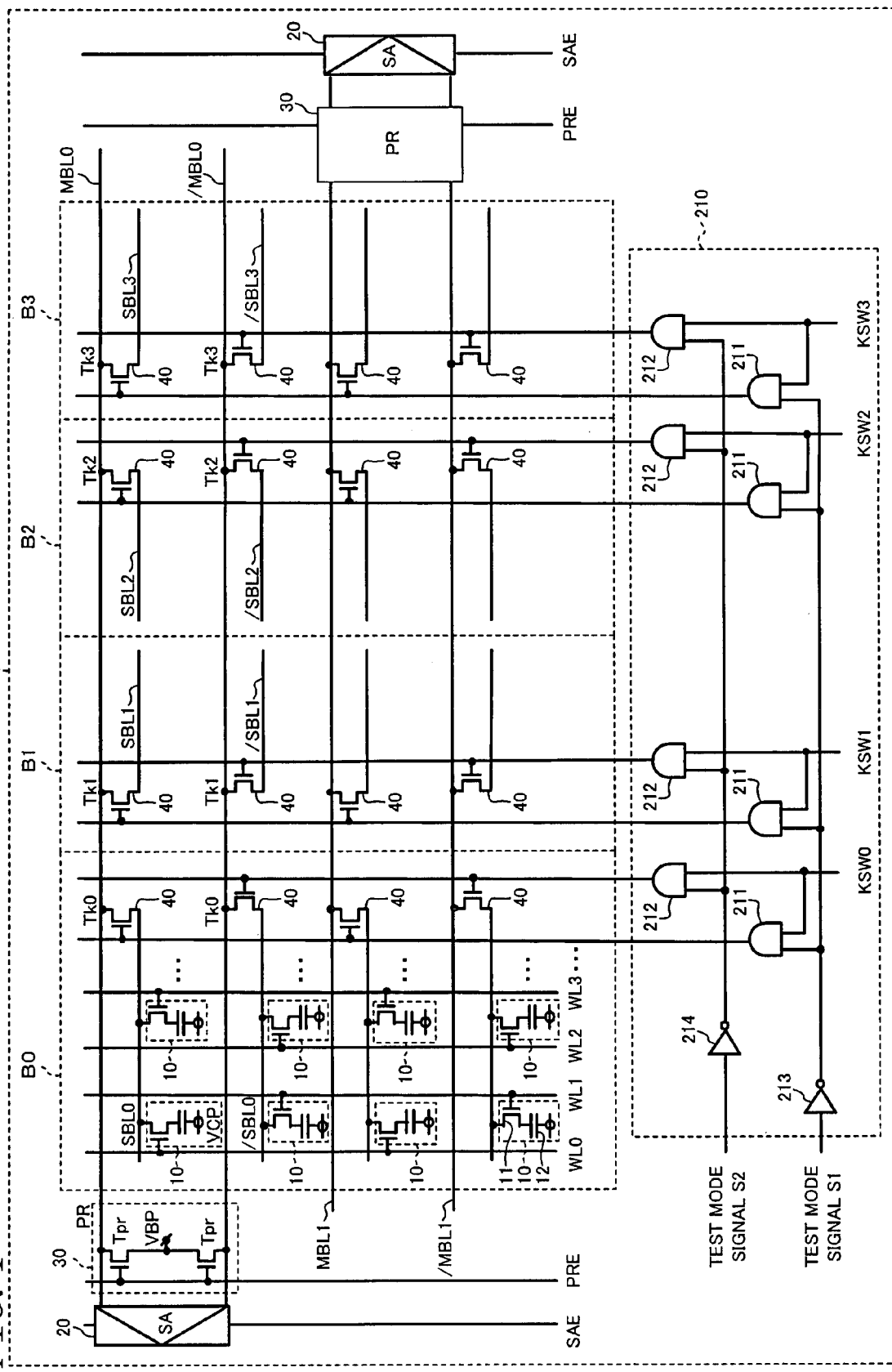
FIG. 4 is a block diagram for showing the architecture of a semiconductor memory according to Embodiment 2 of the invention.

FIG. 4 is a block diagram for showing the architecture of a semiconductor memory 200 according to Embodiment 2 of the invention. In the semiconductor memory 200, the hierarchical switch control unit 50 of the semiconductor memory 100 is replaced with a hierarchical switch control unit 210 as shown in FIG. 4.

The hierarchical switch control unit 210 includes a plurality of AND circuits 211 and a plurality of AND circuits 212, an inverter circuit 213 and an inverter circuit 214, and receives a test mode signal S1 and a test mode signal S2 as inputs. In this embodiment, the test mode signal S1 is a signal corresponding to whether or not leakage of a sub bit line is accelerated. Also, the test mode signal S2 is a signal corresponding to whether or not leakage of a complementary sub bit line is accelerated.

Each AND circuit 211 is provided correspondingly to each sub array. One input terminal of each AND circuit 211 receives the output of the inverter circuit 213, and the other input terminal thereof receives, as an input, a hierarchical switch control signal KSW0, KSW1, KSW2 or KSW3. Furthermore, the output of the AND circuit 211 is connected to a hierarchical switch 40 for connecting a sub bit line and a main bit line.

Also, each AND circuit 212 is provided correspondingly to each sub array. One input terminal of each AND circuit 212 receives the output of the inverter circuit 214 as an input, and the other input terminal thereof receives a hierarchical switch control signal KSW0, KSW1, KSW2 or KSW3 as an input. Furthermore, the output of the AND circuit 212 is connected to a hierarchical switch 40 for connecting a complementary sub bit line and a complementary main bit line.

The inverter circuit 213 outputs a signal obtained by inverting the test mode signal S1. Furthermore, the inverter circuit 214 outputs a signal obtained by inverting the test mode signal S2.

Figure 5:
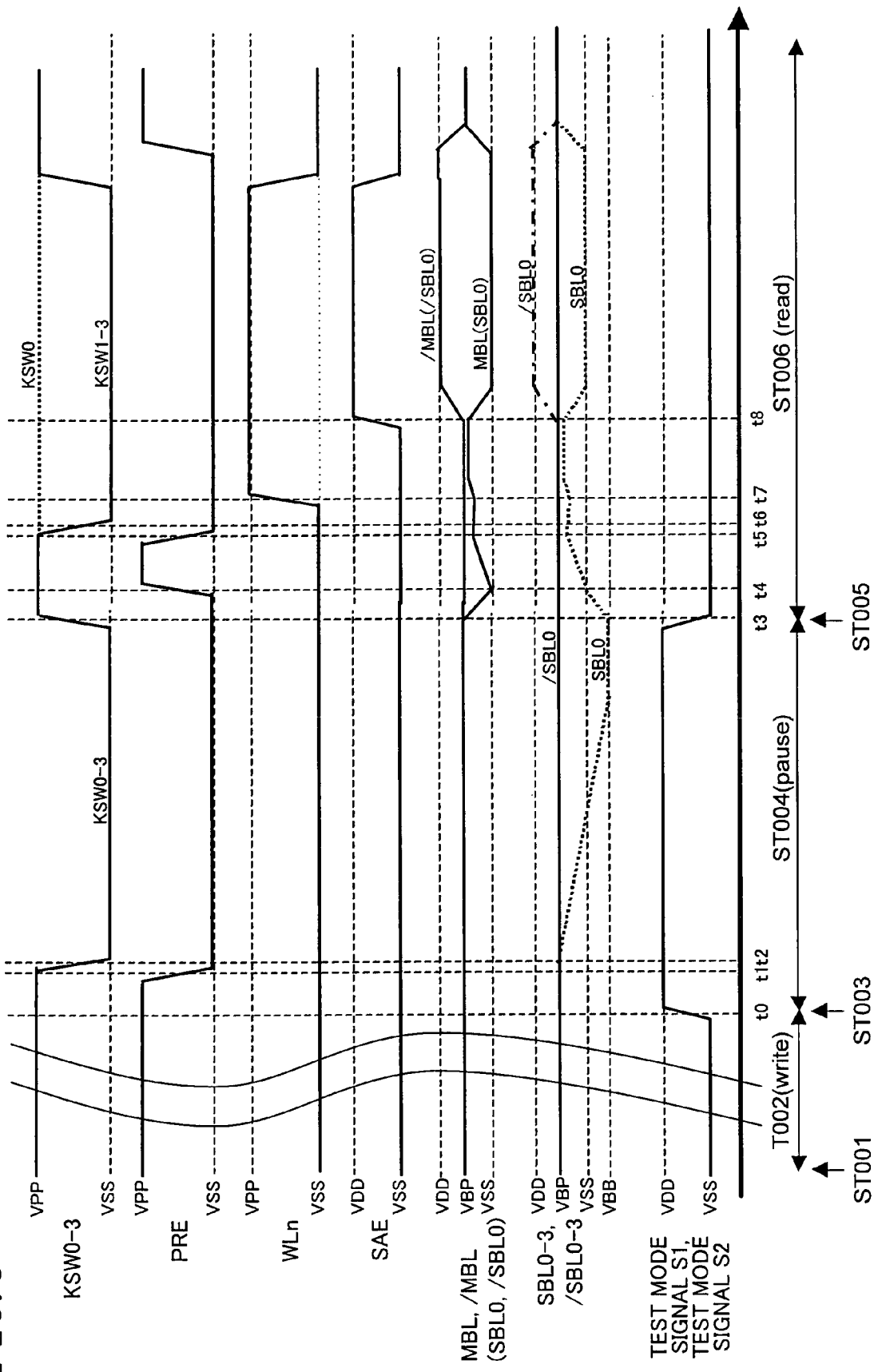
FIG. 5 is a timing chart for performing the leakage test on the semiconductor memory of Embodiment 2.

In the semiconductor memory 200, for detecting leakage of, for example, a sub bit line, the test mode signal S1 is set to H level so as to place the sub bit lines in the floating state as shown in a timing chart of FIG. 5. Furthermore, the complementary sub bit lines are precharged. Under this condition, memory cells 10 connected to the sub bit lines are read for determining whether or not leakage is caused. Similarly, the test mode signal S2 is set to H level so as to place the complementary sub bit lines in the floating state, and under this condition, the leakage test for the memory cells 10 connected to the complementary sub bit lines is performed.

In the case where, for example, leakage is caused in both a sub bit line and a complementary sub bit line, if both the sub bit line and the complementary sub bit line are placed in the floating state, a potential difference that can be amplified by the sense amplifier is caused between the sub bit line and the complementary sub bit line so as to be read as correct data. In such a case, it is apprehended that the leakage cannot be detected. In this embodiment, however, the sub bit lines and the complementary sub bit lines can be separately controlled to be placed in the floating state as described above, and therefore, either the sub bit lines or the complementary sub bit lines can be kept at a level of precharge potential VBP. Thus, the leakage of the memory cells can be more definitely detected in the semiconductor memory 200.

It is noted that the test mode signal S2 may be a signal generated for the leakage test alone or an existing signal such as an address signal.

Embodiment 3

An exemplified semiconductor memory in which potential of a sub bit line having leakage can be lowered to a VBB level in a shorter period of time will now be described.

Figure 6:
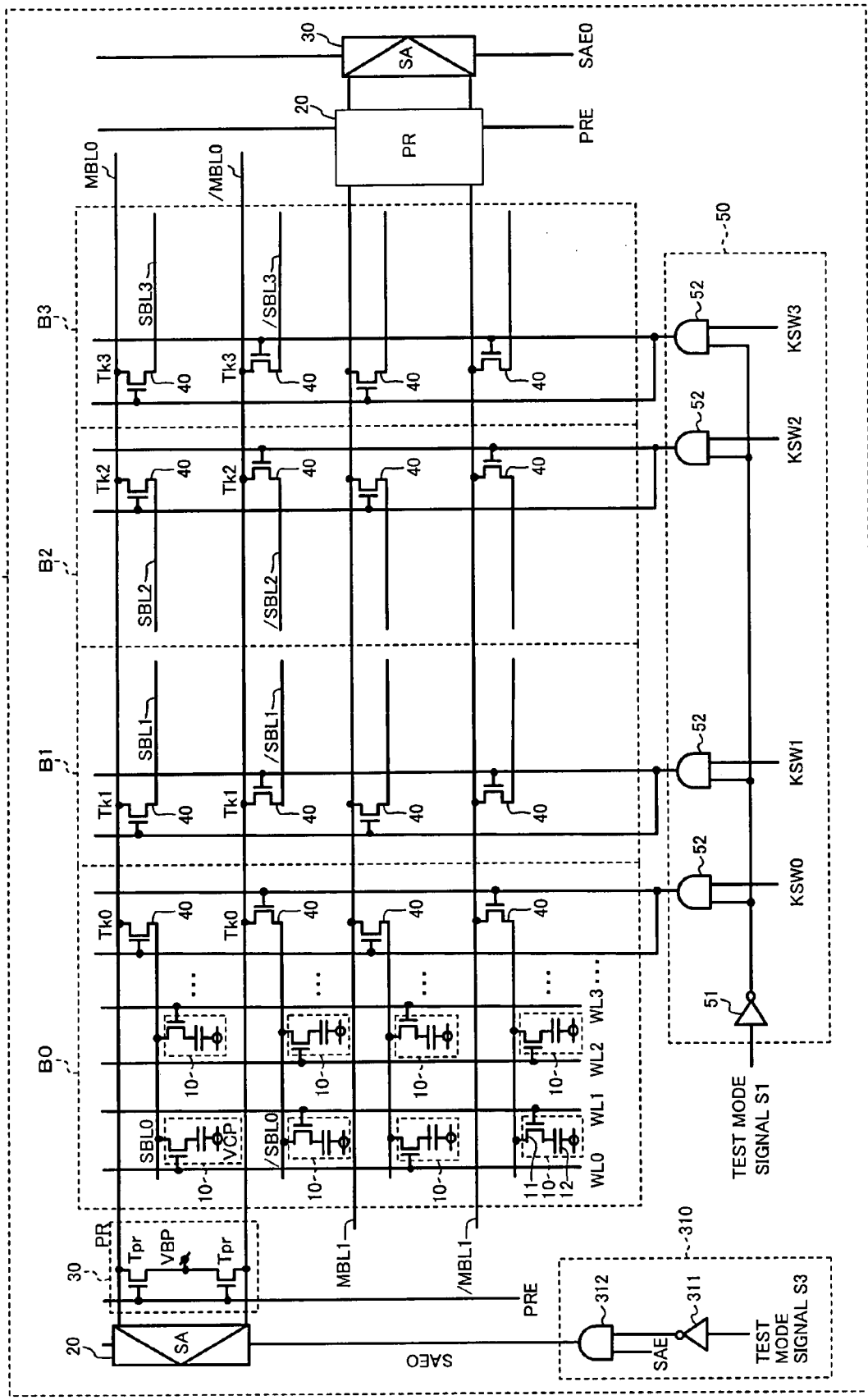
FIG. 6 is a block diagram for showing the architecture of a semiconductor memory according to Embodiment 3 of the invention.

FIG. 6 is a block diagram for showing the architecture of a semiconductor memory 300 according to Embodiment 3 of the invention. In the semiconductor memory 300, a sense amplifier control unit 310 is additionally provided in the semiconductor memory 100 of Embodiment 1 as shown in FIG. 6.

The sense amplifier control unit 310 receives, as inputs, a sense amplifier enable signal SAE and a test mode signal S3 (described below), and outputs a sense amplifier enable signal SAE0 for controlling a sense amplifier 20. Specifically, in this embodiment, the sense amplifier 20 is controlled in accordance with the sense amplifier enable signal SAE0 instead of the sense amplifier enable signal SAE.

The sense amplifier control unit 310 specifically includes an inverter circuit 311 and an AND circuit 312.

The inverter circuit 311 outputs an inverted signal of the test mode signal S3. The test mode signal S3 is a signal for deactivating the sense amplifier 20.

The AND circuit 312 receives, as inputs, the sense amplifier enable signal SAE and the output of the inverter circuit 311. The output of the AND circuit 312 is input to the sense amplifier 20 as the sense amplifier enable signal SAE0. Accordingly, in the case where the test mode signal S3 is at H level, the sense amplifier enable signal SAE0 is always at L level regardless of the signal level of the sense amplifier enable signal SAE. Therefore, the sense amplifier 20 is not activated and hence does not amplify a potential difference appearing on the corresponding main bit line pair. In other words, in the case where the test mode signal S3 is at H level, the sense amplifier 20 is deactivated.

Figure 7:
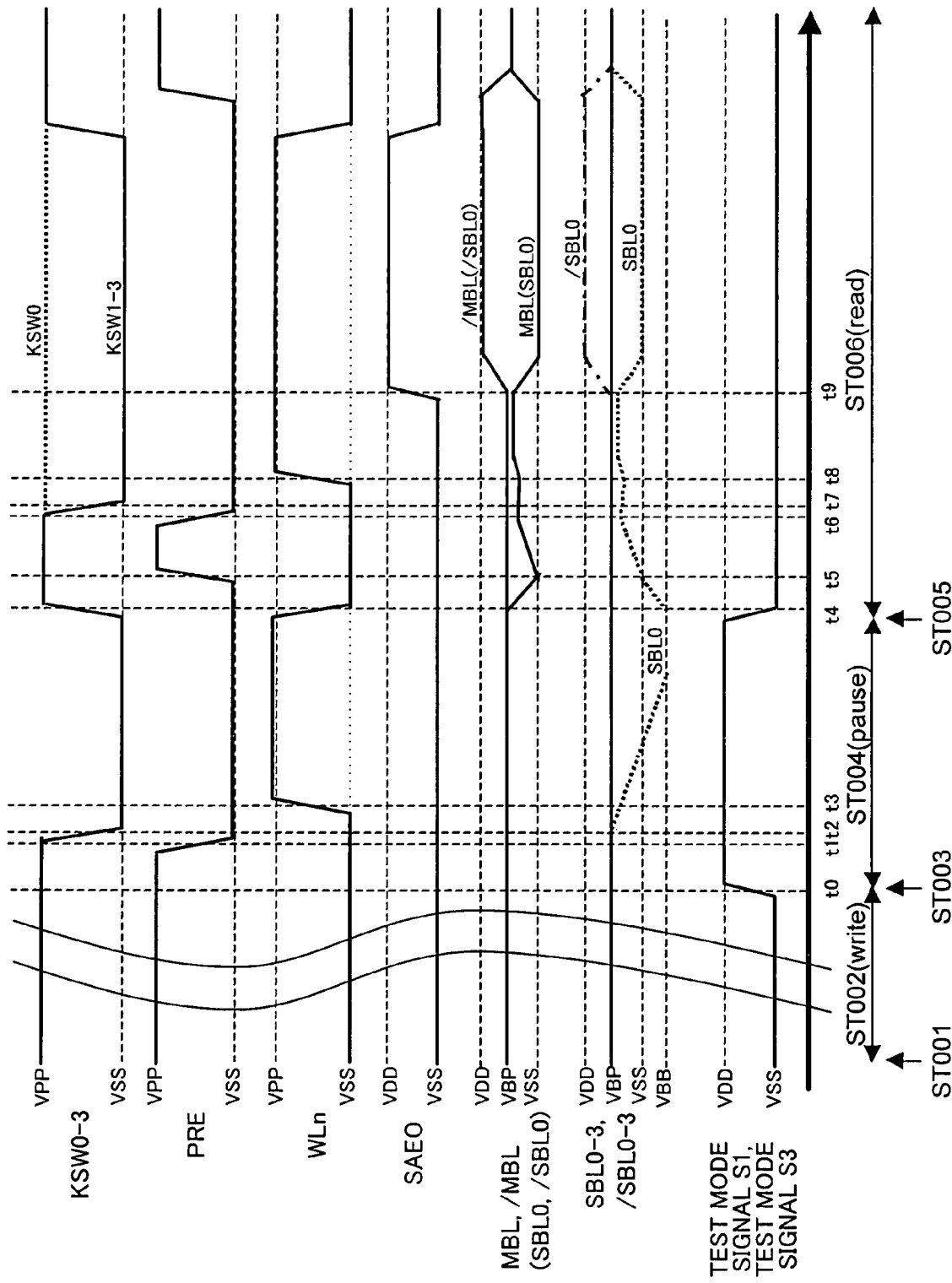
FIG. 7 is a timing chart for performing the leakage test on the semiconductor memory of Embodiment 3.

In the semiconductor memory 300, a word line selected for the leakage test is set to H level during a period of the pause state as shown in a timing chart of FIG. 7. Also during this period, the test mode signal S3 is set to H level so as to deactivate the sense amplifier 20 regardless of the level of the sense amplifier enable signal SAE. Accordingly, even when the word line is at H level, the amplification is not performed before the level of a sub bit line is sufficiently lowered through the leakage.

Furthermore, in each memory cell 10 connected to the word line set to H level, an access transistor 11 is in an on state. Therefore, the sub bit line is electrically connected to the storage node of a memory cell capacitor 12. Accordingly, in the case where, for example, a PN junction formed between a node of the access transistor 11 on the side of the memory cell capacitor 12 and a substrate is short-circuited owing to a defect, the amount of passing current is larger when the access transistor 11 is in an on state than when it is in an off state. Therefore, the precharge potential VBP of the sub bit line is rapidly lowered.

In other words, the potential of a sub bit line having the leakage is lowered to the VBB level in a shorter period of time than in the semiconductor memory of Embodiment 1 or the like. In addition, since the sense amplifier is deactivated in a period when the word line is at H level, the amplification is less possibly performed before the level of the sub bit line is sufficiently lowered through the leakage, and hence, an incorrect test result is less possibly obtained. Accordingly, the leakage test can be more rapidly and more sensitively performed in this embodiment.

It is noted that each of the semiconductor memories of Embodiments 1 through 3 may be provided with a spare memory cell (redundancy cell). In the case where a redundancy cell is provided, even when there is a memory cell causing leakage (a defective memory cell), the semiconductor memory including the defective memory cell can be used by replacing the defective memory cell with the redundancy cell.

In this case, if the defective memory cell is replaced with a spare memory cell correspondingly to one word line (i.e., row redundancy cells are used instead), the defective memory cell is still physically connected to the sub bit line. Therefore, the level of the sub bit line connected to the defective memory cell is lowered through the leakage, which harmfully affects other normal memory cells connected to this sub bit line.

In other words, the sub bit line connected to the defective memory cell is preferably not used. For this purpose, a sub bit line determined to be connected to a defective memory cell in the leakage test of Embodiments 1, 2 or 3 is replaced with spare memory cells corresponding to one main bit line (i.e., column redundancy cells are used instead).

Furthermore, in each of the semiconductor memories of Embodiments 1 through 3, the substrate potential of the transistor included in each memory cell may be controlled during the leakage test. For example, when the absolute value of the substrate potential VBB that is a negative voltage is increased by applying a voltage from the outside of the semiconductor memory during the leakage test, a potential difference between a sub bit line and the substrate is increased. Therefore, the leakage of the sub bit line can be accelerated, and in addition, a memory cell having the leakage can be more sensitively detected.

Moreover, the number of sub bit lines corresponding to one main bit line is described merely as an example and is not limited to that described in Embodiments 1 through 3.

Also, the configurations of the logic circuits and the like for generating the respective signals are described merely as examples and are not limited to those described above.

Furthermore, the levels (H level and L level) of the respective signals and the corresponding functions of the signals are merely illustrative and are not limited those described above.

It is noted that the aforementioned architectures may be variously combined as far as they can be logically combined. For example, in the semiconductor memory of Embodiment 2, an inverter circuit 311 and an AND circuit 312 may be additionally provided so as to control the sense amplifier in the same manner as in the semiconductor memory 300.

As described so far, in the semiconductor memory of the present invention, all the sub bit lines can be placed in the floating state in the leakage test, and hence, the leakage of all the sub bit lines can be accelerated at once, so that the leakage test can be performed in a shorter period of time. In this manner, the present invention is useful as a semiconductor memory including a test circuit for detecting cell transistor leakage failure of a memory cell and a method for testing the same.

What is claimed is:

1. A semiconductor memory comprising:
   a plurality of main bit line pairs each composed of a main bit line and a complementary main bit line;
   a plurality of sub bit line pairs each composed of a sub bit line and a complementary sub bit line and respectively corresponding to said plurality of main bit line pairs;
   a plurality of word lines disposed to intersect said plurality of sub bit line pairs;
   memory cells disposed on intersecting points between said sub bit line and each of said word lines and between said complementary sub bit line and each of said word lines;
   a sub bit line hierarchical switch disposed correspondingly to each sub bit line between said sub bit line and a main bit line corresponding to said sub bit line;
   a complementary sub bit line hierarchical switch disposed correspondingly to each complementary sub bit line between said complementary sub bit line and a complementary main bit line corresponding to said complementary sub bit line; and
   a hierarchical switch control unit for turning off all of said sub bit line hierarchical switch and said complementary sub bit line hierarchical switch when a given signal is input.

2. A semiconductor memory comprising:
   a plurality of main bit line pairs each composed of a main bit line and a complementary main bit line;
   a plurality of sub bit line pairs each composed of a sub bit line and a complementary sub bit line and respectively corresponding to said plurality of main bit line pairs;
   a plurality of word lines disposed to intersect said plurality of sub bit line pairs;
   memory cells disposed on intersecting points between said sub bit line and each of said word lines and between said complementary sub bit line and each of said word lines;
   a sub bit line hierarchical switch disposed correspondingly to each sub bit line between said sub bit line and a main bit line corresponding to said sub bit line;
   a complementary sub bit line hierarchical switch disposed correspondingly to each complementary sub bit line between said complementary sub bit line and a complementary main bit line corresponding to said complementary sub bit line; and
   a hierarchical switch control unit for turning off all of said sub bit line hierarchical switch or said complementary sub bit line hierarchical switch when a given signal is input.

3. The semiconductor memory of claim 1, further comprising:
   a sense amplifier disposed correspondingly to each of said plurality of main bit line pairs for amplifying a potential difference between a main bit line and a complementary main bit line of said main bit line pair; and
   a sense amplifier control unit for deactivating said sense amplifier when a given control signal is input.

4. The semiconductor memory of claim 1, further comprising a redundancy memory cell replaceable with each of said memory cells,
   wherein a memory cell is replaced with said redundancy memory cell correspondingly to each main bit line.

5. A test method for the semiconductor memory of claim 1, comprising:
   a precharge step of precharging said plurality of main bit line pairs; and
   a leakage accelerating step of supplying said given signal to said hierarchical switch control unit and increasing an absolute value of substrate potential of transistors included in said memory cells after completing the precharge step.

6. The semiconductor memory of claim 1,
   wherein said given signal is a test mode signal.

7. The semiconductor memory of claim 1,
   wherein said hierarchical switch control unit includes an AND circuit that receives, as inputs, said given signal and a hierarchical switch control signal and outputs a signal for controlling turn on/off of said sub bit line hierarchical switch and said complementary sub bit line hierarchical switch.

8. The semiconductor memory of claim 3,
   wherein said sense amplifier control unit includes an AND circuit that receives, as inputs, said given signal and a sense amplifier control signal and outputs a signal for controlling activation/deactivation of said sense amplifier.

9. The semiconductor memory of claim 2, further comprising:
   a sense amplifier disposed correspondingly to each of said plurality of main bit line pairs for amplifying a potential difference between a main bit line and a complementary main bit line of said main bit line pair; and
   a sense amplifier control unit for deactivating said sense amplifier when a given control signal is input.

10. The semiconductor memory of claim 2, further comprising a redundancy memory cell replaceable with each of said memory cells,
    wherein a memory cell is replaced with said redundancy memory cell correspondingly to each main bit line.

11. A test method for the semiconductor memory of claim 2, comprising:
    a precharge step of precharging said plurality of main bit line pairs; and
    a leakage accelerating step of supplying said given signal to said hierarchical switch control unit and increasing an absolute value of substrate potential of transistors included in said memory cells after completing the precharge step.

12. The semiconductor memory of claim 2,
    wherein said given signal is a test mode signal.

13. The semiconductor memory of claim 2,
    wherein said hierarchical switch control unit includes an AND circuit that receives, as inputs, said given signal and a hierarchical switch control signal and outputs a signal for controlling turn on/off of said sub bit line hierarchical switch and said complementary sub bit line hierarchical switch.

14. The semiconductor memory of claim 9,
    wherein said sense amplifier control unit includes an AND circuit that receives, as inputs, said given signal and a sense amplifier control signal and outputs a signal for controlling to activation/deactivation of said sense amplifier.

* * * * *